(12) United States Patent
Gebele et al.

(10) Patent No.: US 6,332,525 B1
(45) Date of Patent: Dec. 25, 2001

(54) VACUUM CHAMBER FOR FLAT SUBSTRATES

(75) Inventors: Thomas Gebele, Freigericht; Gert Rödling, Obertshausen, both of (DE)

(73) Assignee: Leybold Systems GmbH, Hanau (DE)

( * ) Notice: Subject to any disclaimer, the term of this patent is extended or adjusted under 35 U.S.C. 154(b) by 0 days.

(21) Appl. No.: 09/549,544

(22) Filed: Apr. 14, 2000

(30) Foreign Application Priority Data

Apr. 14, 1999 (DE) .................................... 199 16 666

(51) Int. Cl.$^7$ .................................... B65G 13/00
(52) U.S. Cl. .................................... 193/35 R; 193/37
(58) Field of Search .................................... 193/35 R, 37; 198/780, 782, 783, 784, 788

(56) References Cited

U.S. PATENT DOCUMENTS 3,807,546 * 4/1974 Lananalo .................... 193/37 X
4,300,937 * 11/1981 Rhonehouse ................. 198/790 X
5,160,940 * 11/1992 Lassou et al. ............... 198/785 X

FOREIGN PATENT DOCUMENTS

| 32 23 970 A1 | 1/1988 | (DE) . |
| 254 398 B5 | 2/1988 | (DE) . |
| 43 03 462 C2 | 3/1994 | (DE) . |

* cited by examiner

Primary Examiner—James R. Bidwell
(74) Attorney, Agent, or Firm—Smith, Gambrell & Russell, LLP

(57) ABSTRACT

A vacuum chamber for flat substrates features transport rollers for transport of the substrates. These transport rollers are held from the sides in bearings and are additionally braced between the bearings by at least one middle bearing. These middle bearings are each located on a plunger which is guided hermetically through an opening in the bottom of the vacuum chamber and is braced against a support underneath the bottom.

8 Claims, 1 Drawing Sheet

VACUUM CHAMBER FOR FLAT SUBSTRATES

BACKGROUND OF THE INVENTION

1. Field of the Invention

The invention pertains to a vacuum chamber for flat substrates in which transport rollers provided for transporting the substrates are located above the bottom of the vacuum chamber and held at their two ends by one bearing each.

2. Discussion of the Prior Art

Vacuum chambers of this kind are being used, in particular, as lock chambers for flat glass coating systems, and are in general already known. In order to achieve the greatest possible process speed with installations of this kind, it is necessary to evacuate the vacuum chamber as quickly as possible. This can be achieved by using the smallest possible volume for the vacuum chamber and by using the greatest possible power for the pump which is used to evacuate the vacuum chamber.

At the present time, a drawn-in chamber cover, displacement elements between the transport rollers, and vacuum-tight transport rollers are known as means to reduce the chamber volume. It is possible by these means to reduce the chamber volume significantly. An additional, important reduction in the chamber volume would be possible if transport rollers with a smaller diameter could be used. But this design change is hindered by the fact that the transport rollers can only be supported by bearings at their ends and often must have a length of several meters. But, since they can only have a limited flexure to ensure a safe and direction-stable transport of the flat substrate, the large, free length necessarily requires a relatively large transport roller diameter, often more than 10 cm in today's equipment. An additional transport roller bearing in the middle of the vacuum chamber is not possible with the means available at the present time, because the chamber bottom acts like a membrane and moves by more than 1 mm during evacuation and ventilation.

SUMMARY OF THE INVENTION

The invention is based on the problem of designing a vacuum chamber of the kind described above such that it has the smallest possible chamber volume for a predetermined substrate size.

This problem is solved according to this invention in that the transport rollers are additionally supported between the outer bearings by at least one middle bearing which is located on a plunger which is guided hermetically through an opening of the bottom of the vacuum chamber and is braced against a support underneath the bottom.

According to this invention, due to this additional support of the transport rollers between their outer bearings, it is possible to reduce the diameter of the transport rollers by about half without causing undesirable severe flexure. Since the middle bearing is not braced on the bottom of the vacuum chamber by the supporting plunger, but rather braced outside of the vacuum chamber, for example, against the foundation, the movement of the bottom of the chamber does not lead to a shift of the middle bearing, so that the bottom can be designed as before, and expensive bottom reinforcements can now be omitted.

The sealing of the middle bearing plunger against the bottom of the vacuum chamber could be handled by standard gaskets. The sealing is entirely safe from wear and can be created at low cost if, according to a favorable refinement of the invention, the plunger is connected to the bottom of the vacuum chamber by means of a bellows.

A particularly effective gas seal can be attained when the bellows consists of spring steel.

It is a particularly simple and favorable design when the middle bearing is designed as a support bearing, and has two support rollers resting against the underside of the particular transport roller.

For production reasons, it may be advantageous to supply two mutually aligned transport rollers instead of transport rollers extending across the entire width of the vacuum chamber. This can be achieved by this invention, when the transport rollers are divided between the outer bearings in the vicinity of the middle bearing. In this case, the middle bearing can have two support rings side-by-side on the plunger, into which a transport roller lug will extend.

BRIEF DESCRIPTION OF THE DRAWING

The FIGURE shows a cross section through a partial region of one vacuum chamber.

DETAILED DESCRIPTION OF THE INVENTION

Figure 1:
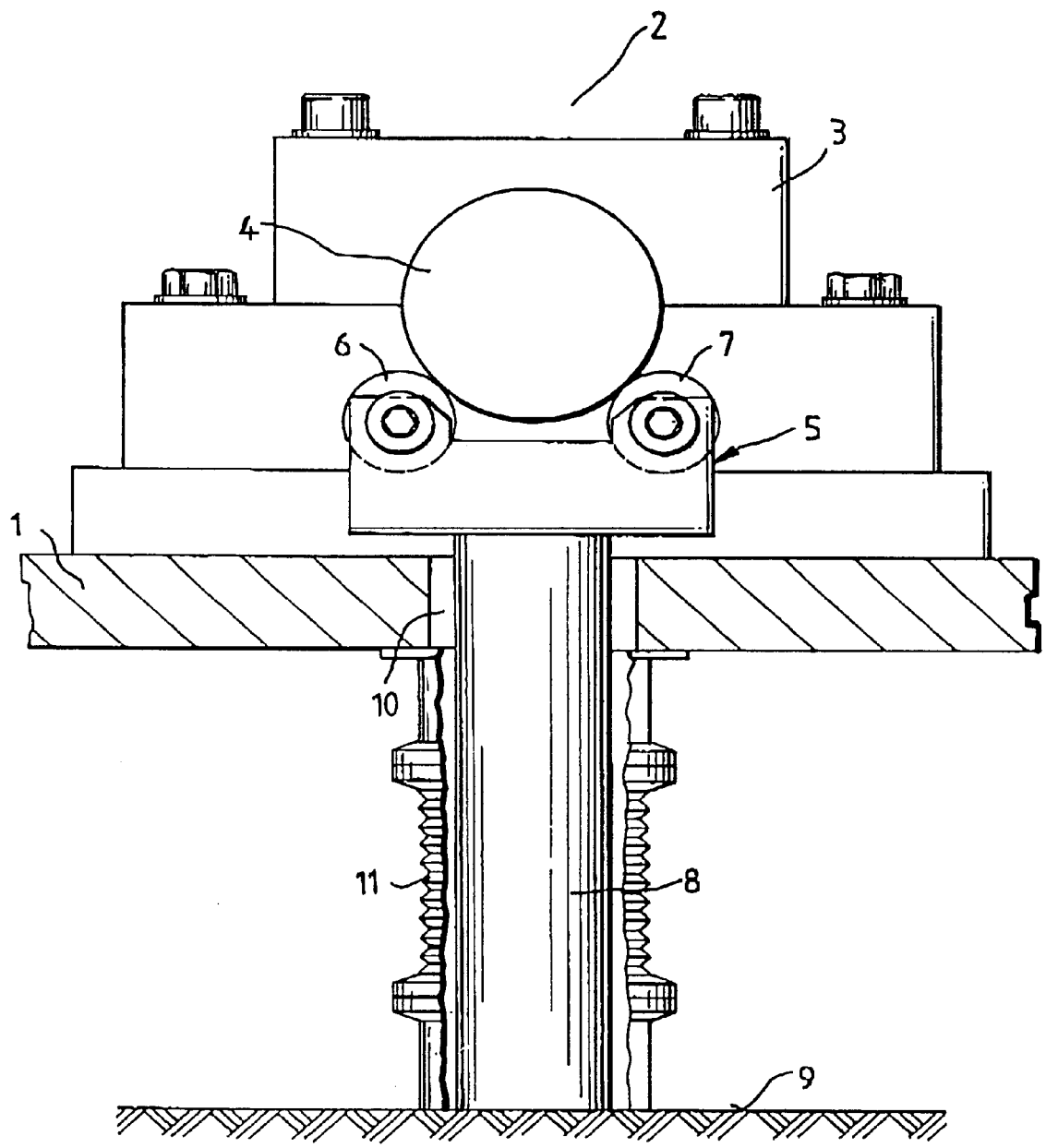

The figure shows a bottom 1 of a vacuum chamber 2. In this vacuum chamber 2, there is an outer bearing 3 which supports a transport roller 4 at one end. The roller is supported by a similar bearing at the opposite end (not illustrated). Below the transport roller 4, there is a middle bearing 5 designed as a support bearing. This middle bearing has two support rollers 6, 7 to support the transport roller 4 between the outer bearings 3.

The plunger 8 is important to the invention. The plunger is braced against a support 9 which can simply be the foundation. This plunger 8 passes through an opening 10 of the bottom 1 of the vacuum chamber 2 and bears the middle bearing 5 on its upper end. In order to prevent air from getting through the opening 10 into the interior of the vacuum chamber 2, a bellows 11 of steel surrounding the plunger 8 is provided between the bottom 1 and the support 9.

Two bearings can be provided on the plunger 8 in the middle region which support one end of a divided transport roller (not illustrated).

What is claimed is:

1. Vacuum chamber for flat substrates, in which transport rollers located above a bottom of the vacuum chamber and held at each of two ends by one bearing are provided for transport of the substrates, wherein the transport rollers are additionally supported between the outer bearings by at least one middle bearing, which is located on a plunger which is guided hermetically through an opening in the bottom of the vacuum chamber and is braced against a support underneath the bottom.

2. Vacuum chamber according to claim 1, wherein the plunger is connected with the bottom of the vacuum chamber by means of a bellows.

3. Vacuum chamber according to claim 2, characterized in that the bellows consists of spring steel.

4. Vacuum chamber according to claim 1, wherein the middle bearing is designed as a support bearing and has two support rollers resting against an underside of the particular transport roller.

5. Vacuum chamber according to claim 1, wherein the transport rollers are divided between the outer bearings in the vicinity of the middle bearing.

6. A transporting system for flat substrates in a vacuum chamber comprising:

a plurality of transport rollers;

end bearings, each supporting one end of one of the plurality of transport rollers;

at least one middle bearing supporting at least one of the plurality of transport rollers between corresponding end bearings;

a plunger supporting said middle bearing, said plunger extending through an opening in the bottom of a vacuum chamber and being braced against a fixed support.

7. A transporting system according to claim 6, further comprising a seal connecting said fixed support to said vacuum chamber and containing therein said plunger.

8. A transporting system according to claim 7, wherein said seal is a bellows of spring steel.

* * * * *